United States Patent [19]

van Vroonhoven et al.

[11] Patent Number: 4,494,227
[45] Date of Patent: Jan. 15, 1985

[54] STEREO PHONO PICK-UP AND/OR CUTTER

[75] Inventors: Casper E. G. M. M. van Vroonhoven; Keimpe van Wijk, both of Eindhoven, Netherlands

[73] Assignee: U.S. Philips Corporation, New York, N.Y.

[21] Appl. No.: 363,354

[22] Filed: Mar. 29, 1982

[30] Foreign Application Priority Data

Apr. 13, 1981 [NL] Netherlands ......................... 8101794

[51] Int. Cl.³ ............................................. H04R 9/16
[52] U.S. Cl. .................................... 369/147; 369/146; 369/170
[58] Field of Search ............... 369/146, 147, 148, 149, 369/136, 170

[56] References Cited

U.S. PATENT DOCUMENTS

| 3,230,318 | 1/1966 | Engel | 369/147 |
| 3,924,076 | 12/1975 | Dubois | 369/146 |
| 3,988,025 | 10/1976 | Nakamura | 369/136 |
| 4,068,850 | 1/1975 | Smit | 369/146 |
| 4,237,347 | 12/1980 | Burendakov | 369/136 |
| 4,251,695 | 2/1981 | Ono | 369/147 |
| 4,327,433 | 4/1982 | Okura | 369/147 |
| 4,345,322 | 8/1982 | Aizawa | 369/146 |

FOREIGN PATENT DOCUMENTS

| 55-34554 | 3/1980 | Japan | 369/146 |
| 55-46663 | 4/1980 | Japan | 369/147 |

Primary Examiner—Alan Faber
Attorney, Agent, or Firm—David R. Treacy

[57] ABSTRACT

A phonograph pick-up or cutter has a stylus holder carrying a stylus, which cooperates with two transducers, one for each of two orthogonal directions of vibration. Each transducer has a flat coil and an associated magnet having their axes in line. For each transducer the direction of relative movement of the coil to the magnet corresponds to the direction of the coil axis and the magnetic axis. The stylus holder is connected to the moving parts of the two transducers by a coupling member. Preferably, the moving part is arranged on a support connected to the stationary part, to minimize undesired transverse movements.

12 Claims, 4 Drawing Figures

STEREO PHONO PICK-UP AND/OR CUTTER

BACKGROUND OF THE INVENTION

The invention relates to a pick-up and/or cutter (hereinafter referred to as a cartridge) for scanning and/or recording information in a track of a disc-shaped record carrier. Such information is constituted by signals being stored in two orthogonal directions of vibration in the track. The cartridge comprises a stylus holder which carries a stylus at one end, which stylus holder is movable in two orthogonal directions in a plane perpendicular to the track, and cooperates with two transducers, one for each of the two orthogonal directions of vibration. Each transducer is provided with a magnet and an associated coil and, for each transducer, the direction of movement of the coil relative to the magnet corresponds to the direction of the coil axis and the magnetic axis of the magnet, which two axes at least substantially coincide. The coil axis is to be understood to mean the axis of symmetry of the coil which is substantially perpendicular to the turns of the coil.

The stylus holder is connected to the moving parts to the two transducers by means of a coupling member. The coupling member serves to decouple the composite movement of the stylus holder in both directions of vibration in such a way that the transducer corresponding to the one direction of vibration is insensitive to movements of the stylus holder in the other direction of vibration and vice versa. Typical known moving coil pick-ups mount the coil on a comparatively thin foil, and are constructed so that the coil is sensitive to movement perpendicular to the coil axis. This arrangement leads to undesired movements of the coil in directions perpendicular to the plane of the foil, that is, perpendicular to the desired direction of movement, which necessitates the insertion between the pole-pieces and the coil of a material which damps the undesired movement.

A pick-up of the type mentioned in the opening paragraph is known from U.S. Pat. No. 3,988,025. This known pick-up has the disadvantage that it comprises many separate parts, so that its construction is very intricate. Therefore, the manufacture of such a pick-up is very time-consuming and the parts must be made to very tight tolerances. Thus this known pick-up expensive.

SUMMARY OF THE INVENTION

An object of the invention is to reduce the cost of such a pick-up by making it easy to manufacture, for example by using parts with wider tolerances.

The cartridge according to the invention is characterized in that the coil is a flat coil and the plane of the coil is spaced from the associated magnet. As a result of this construction, each transducer has a magnetic circuit which may solely comprise a magnet and a coil, the plane of the coil being spaced from the associated magnet. Additional pole pieces and a magnetic return circuit are then no longer needed, so that a number of parts may be dispensed with. Moreover, the part of the pick-up which previously served as magnetic return circuit (for example the "stationary part" of the pick-up, see hereinafter) may be made of a non-magnetic material, for example a plastic, so that the weight of the pick-up can be reduced substantially.

In one embodiment in accordance with the invention the coil is the moving part of each of the transducers and is arranged on a flexible support, which support, at least on one side, is connected to a stationary part of the pick-up, on which part the magnets are arranged. By constructing the coil as a moving part and having this part move in a direction corresponding to its axis, better control of the movement is possible. This is in contradistinction to the typical known moving-coil pick-ups whose coils are arranged on a comparatively thin foil and sometimes move in an undesired direction perpendicular to their axes.

In the cartridge in accordance with the invention these undesired movements do not occur, so that no additional damping materials need be provided, because damping is obtained by a suitable choice of the type and composition of the material of the support. This leads to a simpler and cheaper construction. Suitably, the flexible support is made of a non-conductive material, and the coil is arranged on a major surface of the support in the form of printed wiring. This results in a very light construction, the support providing the mechanical strength of the coil. The coil can be made by means of printed-circuit techniques, for example by etching away a conductive layer, or by vacuum-deposition or sputtering.

In a further embodiment the electrical connections for the coil also extend over the major surface of the support, in the form of printed wiring, from the coil to that side of the support where it is connected to the stationary part of the cartridge. This results in a very reliable electrical connection between the moving part, in the form of the coil, and the stationary part of the cartridge.

In yet another embodiment in accordance with the invention, in which the magnet constitutes the moving part of each of the cartridge transducers, the magnet is arranged on or in a flexible support, which support, at least on one side, is connected to a stationary part of the cartridge on which part the coils are arranged. This enables the coil to be provided with a greater number of turns, which increases the sensitivity, while the mass of the coil no longer affects the moving mass. Suitably, the support is made of a plastic material and the magnet is constituted by permanent-magnetic particles which are embedded in the material of the support. This results in a very simple construction with few separate components, so that this step presents great advantages with respect to manufacturing technology. Moreover, the coils are stationary, which excludes breakage of the connections as a result of fatigue due to the movements. In all embodiments it is very effective to connect the support to the stationary part of the cartridge on two opposite sides. This enables the support to be fitted under pretension, so that it can take up the force exerted by the support and caused by the stylus force.

Yet another cartridge in accordance with the invention is characterized in that the magnet of each transducer comprises two oppositely magnetized hard-magnetic parts, which are interconnected by a part of a soft-magnetic material, the magnetic axes of the hard-magnetic parts being disposed at least substantially in line, and that the part of a soft-magnetic material is disposed within the coil. This step may lead to a higher magnetic flux at the location of the coil, thereby increasing the sensitivity of the cartridge. Moreover, the magnetic field at the location of the coil becomes more homogeneous, so that distortion is reduced. Embodiments of the invention will be described in more detail with reference to the drawing.

DESCRIPTION OF THE PREFERRED EMBODIMENTS

Figure 1:
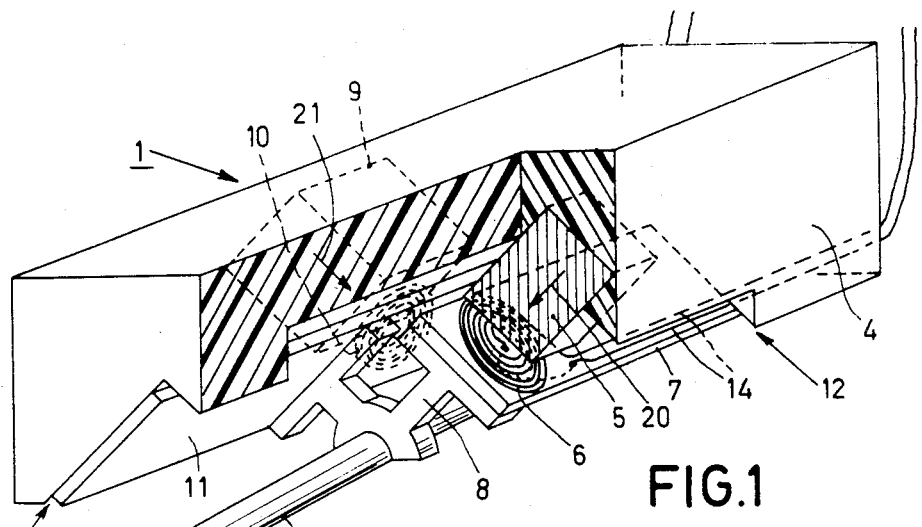
FIG. 1 is a perspective view, partly in section, of a first embodiment of a cartridge in accordance with the invention, the coils forming the moving part of the two transducers.

FIG. 1 shows a pick-up 1, which is provided with a stylus holder 2, on one end of which a stylus 3 is arranged. On the other end, not shown, the stylus holder is arranged in a stationary part 4 of the pick-up 1 so as to be movable to all sides. The pick-up further comprises two transducers, one for each of the two orthogonal directions of vibration. The transducer for the first direction of vibration comprises a magnet 5, which in the present case is connected to the stationary part 4, and a flat coil 6 which is arranged on a major surface of a flexible support 7. The plane of the flat coil 6 is spaced from the magnet 5, as can be seen in the FIGURE. Vibrations of the stylus holder in the first direction of vibration are transmitted to the support 7 via a coupling member 8, so that the coil 6 is made to vibrate, the direction of movement of the coil corresponding to the magnetic axis of the magnet 5, represented by the arrow 20. The transducer for the second direction of vibration comprises a magnet 9 and a coil 10. The magnet 9 is connected to the stationary part 4. The associated flat coil 10 is arranged on a major surface of a flexible support 11. Again the plane of the flat coil 10 is spaced from the magnet 9. Vibrations of the stylus holder 2 in the second direction of vibration are transmitted to the support 11 via the coupling member 8, so that the coil 10 is made to vibrate relative to the magnet 9. The direction of vibration of the coil 10 corresponds to the magnetic axis of the magnet 9, indicated by the arrow 21. The operation of the coupling member 8 is such that vibrations of the stylus holder are resolved into the two said orthogonal directions, a vibration of the stylus holder in the one direction of vibration being transmitted almost exclusively to the one transducer, and vice versa.

The flexible supports 7 and 11 may be connected to the stationary part 4 of the pick-up either on one side, as is indicated by 12 for the support 7, the coil preferably being arranged on the free end of the support, or on two facing sides, such as the side of the support 11 corresponding to the side 12 of the support 7, which is not visible in the drawing, and the side designated 13. It is obvious that in practice the same construction of the flexible supports will be selected for both directions of vibration. The coils 6 and 10, and/or their electrical connections, may for example be arranged on the major surfaces of the respective support 7 and 11 in the form of printed wiring. Only the electrical connections 14 of the coil 6 are shown. They extend from the coil 6 over the major surface to that side 12 of the support 7 where it is connected to the stationary part 4 of the pick-up. Since each transducer solely comprises a magnet and an associated coil, no pole pieces or magnetic return circuit being required, the stationary part 4 can be made of a non-magnetic material, for example a plastic, which renders the pick-up very light.

Figure 2:
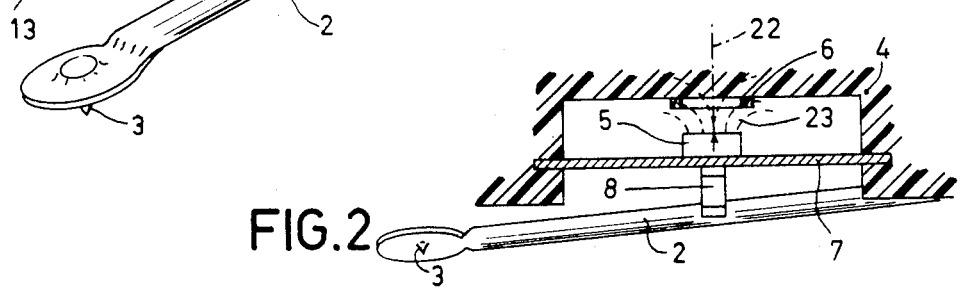
FIG. 2 shows a transducer in which the magnet constitutes the moving part.

A further embodiment can be obtained by arranging the two magnets 5 and 9 on the supports 7 and 11, and the two coils 6 and 10 on the stationary part 4 of the pick-up 1. This is shown in FIG. 2, which shows one of the transducers in this second embodiment. Here, the magnet 5 is arranged on the flexible support 7, which on two facing sides is connected to the stationary part 4 of the pick-up, the flat coil 6 also being connected to the stationary part 4. In this case the magnets move, the direction of movement again coinciding with the magnetic axis of the magnet and the coil axis, which two axes substantially coincide. Obviously, the magnetic axis of a magnet arranged on a support is disposed at least substantially perpendicularly to the plane of the support and in line with the axis of the coil 6, represented by the dash-dot line 22. The magnetic field is represented by the broken lines 23.

Figure 3:
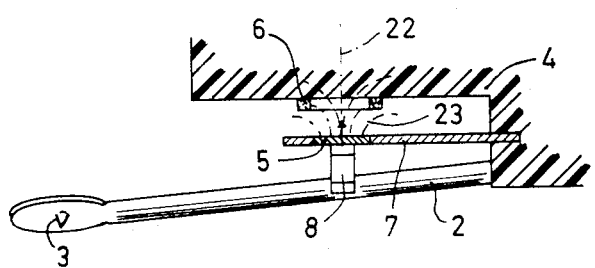
FIG. 3 shows a different embodiment of a transducer, in which the magnet constitutes the moving part.

A further embodiment, based on the example of FIG. 2, can be obtained by making the flexible support of a plastic material and embedding permanent magnetic particles, which together constitute the magnet, in the material of the support at the appropriate location opposite the coil, as is shown in FIG. 3. Here, by way of example, the plastic flexible support 7 is connected to the stationary part 4 of the pick-up at one side only. The magnetic axis of the magnet 5 is again disposed at least substantially perpendicularly to the plane of the support and is disposed in line with the axis of the flat coil 6, represented by the dash-dot line 22. The magnetic field is represented by the broken lines 23.

Figure 4:
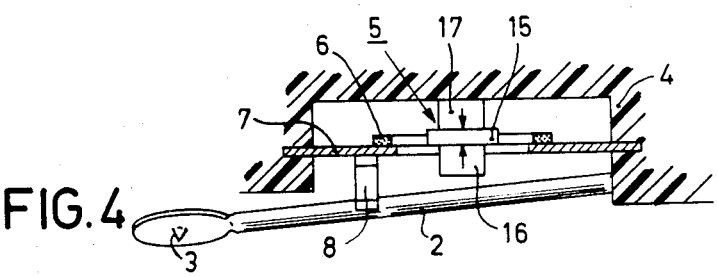
FIG. 4 shows a transducer in which the magnet comprises two oppositely magnetized hard-magnetic parts.

FIG. 4 shows another variant based on the embodiment of FIG. 1. The coil 6 is arranged on the support 7, which is connected to the stationary part 4 on two facing sides. Here the magnet 5 comprises two oppositely magnetized hard-magnetic parts 16 and 17, which are interconnected through a part of a soft-magnetic material 15. The magnetic axes of the two parts 16 and 17 are disposed in line and again, at least substantially, coincide with the axis of the flat coil. As can be seen in the Figure, the magnet 5 projects through a hole in the support, in such a way that the soft-magnetic part 15 is located within the coil. This construction ensures that in the soft-magnetic part 15 the magnetic flux caused by the two hard-magnetic parts is deflected from a direction perpendicular to the major surface of the support into a direction in or parallel to the plane of the support. Moreover, the magnetic flux is increased and more concentrated at the location of the coil. This results in a pick-up with a higher sensitivity and a lower distortion.

Obviously, it is also possible to have an embodiment in which the magnet 5 is arranged on the support and the flat coil 6 on the stationary part 4. Since the moving part of the transducer, owing to the addition of the part 16 and the soft-magnetic part 15, has a larger mass, this will give rise to increased discwear.

It is to be noted that the term pick-up in the foregoing can refer to a pick-up and/or cutter. Furthermore it is to be noted that the scope of the invention is not limited to the embodiments shown, but that the invention is also applicable to those constructions which differ from these embodiments with respect to points which do not relate to the inventive concept.

What is claimed is:

1. A cartridge for scanning and/or recording information in two orthogonal directions of vibration in a track of a record carrier, comprising:

a cartridge stationary part, a stylus holder, mounted to said stationary part for movement in said two orthogonal directions in a plane perpendicular to the track of a record carrier, and having an end and a stylus carried at said end, two transducers, each having a magnetic circuit including a respective transducer magnet part having a magnetic axis and a respective transducer coil part having a coil axis, said axes of the respective parts of a transducer being substantially coincident, one of the respective parts of each transducer being mounted for movement relative to the other part along the respective axis, and a coupling member for connecting the movable part of each transducer to the stylus holder for movement along the respective transducer part axis corresponding to a respective one said orthogonal directions, characterized in that each coil is a flat coil defining a plane, the plane being spaced from the respective magnet.

2. A cartridge as claimed in claim 1, characterized in that said magnet is the sole magnetic element defining the magnetic circuit of each respective transducer.

3. A cartridge as claimed in claim 1 or claim 2, characterized in that the respective coil is the moving part of each of the transducers, is formed by printed wiring, and is axially spaced from the respective magnet.

4. A cartridge as claimed in claim 1, characterized in that the magnet of each transducer comprises two oppositely magnetized hard-magnetic parts and a part made of a soft-magnetic material, interconnecting the respective hard-magnetic parts, the magnetic axes of the respective hard-magnetic parts being disposed at least substantially in line; and in that said part made of a soft-magnetic material is disposed within the respective coil.

5. A cartridge as claimed in claim 1, characterized by comprising two flexible supports, one for each respective transducer, each support being connected to a stationary part of the cartridge on which the coils are arranged; and in that the respective magnets constitute the moving part of each of the transducers, and are arranged on the respective flexible support.

6. A cartridge as claimed in claim 5, characterized in that the support is made of a plastic material and the magnet is constituted by permanent-magnetic particles which are embedded in the material of the support.

7. A cartridge as claimed in claim 5 or 6, characterized in that the support is connected to the stationary part at two opposite sides of the support.

8. A cartridge for scanning and/or recording information in two orthogonal directions of vibration in a track of a record carrier, comprising:

a cartridge stationary part, a stylus holder, mounted to said stationary part for movement in said two orthogonal directions in a plane perpendicular to the track of a record carrier, and having an end and a stylus carried at said end, two transducers, each having a magnetic circuit including a respective transducer magnet part having a magnetic axis and a respective transducer coil part having a coil axis, said axes of the respective parts of a transducer being substantially coincident, one of the respective parts of each transducer being mounted for movement relative to the other part along the respective axis, and a coupling member for connecting the movable part of each transducer to the stylus holder for movement along the respective transducer part axis corresponding to a respective one said orthogonal directions, characterized by comprising two flexible supports, a respective one of said supports being associated with each transducer, each support being connected on at least one side to said stationary part; and in that the moving part of each of the transducers is the coil, said coil being formed as a flat coil defining a plane and arranged on the respective flexible support, said coil being spaced from the respective magnet.

9. A cartridge as claimed in claim 8, characterized in that said magnet is the sole magnetic element defining the magnetic circuit of each respective transducer.

10. A cartridge as claimed in claim 9, characterized in that each of said coils in axially spaced from the respective magnet.

11. A cartridge as claimed in claim 8 or 9, characterized in that each of said flexible supports is made of a non-conductive material, and said coil is formed by printed wiring arranged on a major surface of the respective support.

12. A cartridge as claimed in claim 11, characterized by comprising electrical connections for each of the respective coils, arranged to extend in a form of printed wiring over the respective major surface of the support, from the coil to that side of the support where it is connected to the stationary part of the cartridge.

* * * * *

UNITED STATES PATENT AND TRADEMARK OFFICE
CERTIFICATE OF CORRECTION

PATENT NO. : 4,494,227
DATED : January 15, 1985
INVENTOR(S) : CASPER E.G.M.M. VAN VROONHOVEN ET AL It is certified that error appears in the above—identified patent and that said Letters Patent is hereby corrected as shown below:

Col. 5, line 17, (Claim 1, line 20) after "respective one" insert --of--;

Col. 6, line 23, (Claim 8, line 20) after "respective one" insert --of--;

line 38, (Claim 10, line 2) change "in" to --is--.

Signed and Sealed this

Eighteenth Day of June 1985

[SEAL]

Attest:

DONALD J. QUIGG

Attesting Officer

Acting Commissioner of Patents and Trademarks